(12) United States Patent
Dunne et al.

(10) Patent No.: US 7,920,080 B2
(45) Date of Patent: *Apr. 5, 2011

(54) CORRELATED NOISE AND SPURIOUS SIGNAL REDUCTION

(75) Inventors: Jeremy G. Dunne, Highlands Ranch, CO (US); Samuel J. Andrews, Castle Rock, CO (US)

(73) Assignees: Laser Technology, Inc., Centennial, CO (US); Kama-Tech (HK) Limited, Tsin Sha Tsui (HK)

( * ) Notice: Subject to any disclaimer, the term of this patent is extended or adjusted under 35 U.S.C. 154(b) by 0 days.

This patent is subject to a terminal disclaimer.

(21) Appl. No.: 12/581,743

(22) Filed: Oct. 19, 2009

(65) Prior Publication Data

US 2010/0103004 A1    Apr. 29, 2010

Related U.S. Application Data

(63) Continuation of application No. 12/143,637, filed on Jun. 20, 2008, now Pat. No. 7,619,548.

(51) Int. Cl.
*H03M 1/06* (2006.01)

(52) U.S. Cl. ......... 341/118; 348/302; 359/656; 382/278

(58) Field of Classification Search .......... 341/115–130; 382/278–312, 145; 702/85; 375/261–346; 369/47.52, 116; 356/301, 5.06; 360/85, 360/51, 75, 76; 359/656; 348/302

See application file for complete search history.

(56) References Cited

U.S. PATENT DOCUMENTS

| | | | |
|---|---|---|---|
| 5,361,312 A * | 11/1994 | Kuchel | 382/293 |
| 5,640,381 A * | 6/1997 | Call et al. | 369/47.52 |
| 6,205,183 B1 * | 3/2001 | Dent | 375/261 |
| 6,664,783 B1 * | 12/2003 | Baril et al. | 324/209 |
| 6,917,415 B2 * | 7/2005 | Gogolla et al. | 356/5.06 |
| 7,065,258 B2 * | 6/2006 | Nahum | 382/278 |
| 7,447,247 B1 * | 11/2008 | Doscher | 372/38.02 |
| 2003/0227402 A1 * | 12/2003 | Starzyk et al. | 341/144 |

* cited by examiner

*Primary Examiner* — Lam T Mai

(74) *Attorney, Agent, or Firm* — William J. Kubida; Scott J. Hawranek; Hogan Lovells US LLP

(57) ABSTRACT

Error introduced by analog to digital conversion of a set of laser pulses can be reduced by shifting the clock reference time associated with the firing of the laser pulse. A timing offset module shifts the timing reference of each laser pulse. Digital codes generated by the ADC from the received signals are realigned and summed eliminating systematic error introduced by clock driven operations of the ADC. A comparison of the total ADC output of detected laser pulses over a select number of clock intervals enables a return signal to be distinguishable over the systematic error.

21 Claims, 8 Drawing Sheets

CORRELATED NOISE AND SPURIOUS SIGNAL REDUCTION

RELATED APPLICATION

The present application claims priority from, and is a continuation of, U.S. patent application Ser. No. 12/143,637 filed on Jun. 20, 2008. The disclosure of the foregoing United States Patent Application is specifically incorporated herein by this reference in its entirety and assigned to Laser Technology, Inc., Centennial, Colo. and Kama-Tech (HK) Limited, Hong Kong, China assignees of the present invention.

BACKGROUND OF THE INVENTION

1. Field of the Invention

Embodiments of the present invention relate, in general, to distance measuring equipment and particularly to reducing the effects of systematic error in the analog to digital conversion of detected laser pulses.

2. Relevant Background

Laser range finding apparatuses determine distance measurements based on a round trip calculation of the time of flight of laser pulses. The detection of reflected laser pulses depends on photodiodes, and the two major categories of receiver photodiodes used in laser detection are P-type Intrinsic N-type ("PIN") diodes and avalanche photodiodes ("APD").

When using time of flight to measure distances, the time of flight is the time needed for a laser pulse to travel from the laser range finder to the target and back. Here, the term "reflected pulse" means a laser pulse that has been reflected from a target, and the term "detected pulse" means a reflected pulse that has been detected at a detection unit, i.e. a receiver photodiode. For a pulse to be detected it must be of sufficient intensity to distinguish itself from noise.

While this concept is theoretically simple, in practice it is more difficult to obtain readings due to the variability of a number of factors. For example, different targets can have different surface characteristics such as color and can be positioned in different environments having different backgrounds. Different colors and backgrounds can affect the intensities of the reflected laser pulses. Therefore, even when the distances from the laser range finder to a first target and to a second target are identical, the intensity of the detected pulses from the first and second targets may be substantially different.

Most long distance laser range finders utilize APDs. APDs possess an electro-optic gain which eliminates or significantly reduces the effect of noise produced by the receiver. A PIN diode does not provide such an electro-optic gain thus requiring the received signal to distinguish itself over an often substantial amount of noise. Thus, while the PIN diode functions adequately for short range returns wherein the signal to noise ratio is relatively high, long range detection has long relied on APD based detectors. Unfortunately, APDs are substantially more expensive than PIN diodes. Thus, a design tradeoff is often made between the competing factors of cost and performance.

Theoretically, the noise associated with a PIN diode based detection circuit can be accommodated for by firing more pulses and summing the results. Random noise is proportional to the summation of the square root of the number of pulses while the actual laser return signal varies linearly with the number of pulses. Accordingly, the more pulses you fire the better the signal to noise ratio. However, in practice, a limit is placed on this approach by resolution of the Analog to Digital Converter ("ADC") and systematic noise induced into the system that is linked to the clock running the ADC. Thus, the limit of using PIN diodes has been associated with a combination of the ADC resolution and systematic noise correlated with the clocking frequency that is running the ADC.

Systematic noise in ADCs is synchronized with the edge of the clock pulse driving the ADC. This type of noise is well known to one skilled in the relevant art and is often regarded as insignificant as compared to other sources of error such as random noise. However, as other sources of noise are addressed, this systematic noise source becomes problematic. And, while error linked with the running of a clock found in a processor or an Application Specific Integrated Circuit ("ASIC"), and the like can be shielded from the detection circuit, systematic error associated with an ADC remains a challenge. ADC systematic error is induced by the actual working components of the ADC. ADC designs include switches that alternate between multiple parallel pathways to convert analog signals to digital signals. This switching is linked to the clock frequency and other sub-harmonic clock frequencies resulting in systematic noise.

These errors act to mask the detection of incoming signals in PIN diodes. While the use of certain ADCs can overcome many of these problems, the cost associated with such a solution is prohibitive. Reducing the effects of correlated noise, spurious signals, and systematic clock errors associated with an ADC is desirable.

SUMMARY OF THE INVENTION

Briefly stated, embodiments of the present invention involve systems and methods for reducing error introduced by the analog to digital conversion of an analog signal. According to embodiments of the present invention, the impact of systematic error resulting from the clock driven operation of the ADC is significantly reduced.

An embodiment of the present invention reduces error introduced by analog to digital conversion of a set of laser pulses using a timing offset module that shifts the timing reference of each laser pulse in the set of laser pulses prior to pulse firing. According to an embodiment of the present invention, the ASIC then realigns digital codes generated by the ADC from the returned or reflected detected laser pulses. This realignment eliminates systematic clock error introduced by clock driven operation of the ADC. The CPU then compares total ADC output of the plurality of detected laser pulses over a select number of clock pulses to identify a reflected return.

One method for reducing error resulting from the conversion of a set of analog laser pulses to digital output, according to an embodiment of the present invention, begins by uniquely shifting each laser pulse firing's reference clock time. The degree and frequency of the shifting is based on the repetitive or systematic error introduced by the clock driven switching of the ADC. From the set of fired laser pulses returns a set of reflected laser pulses, each associated with one of the originally fired pulses. These detected pulses are each converted from their analog form to a set of digital output codes by the ADC. Each set of digital output codes associated with each detected laser pulse is stored in memory. The ASIC or similar device, according to one embodiment of the present invention, realigns each set of digital codes with each other set of digital codes thereby eliminating systematic error caused by clock driven switching of the ADC. These aligned sets of digital codes are summed. Thereafter each bit in a subset of bits of the ADC summation is compared with each other bit in the subset to identify a statistically significant difference which indicates a target return. When no return is identified, a new subset of clock pulses is selected and a new comparison is conducted. The process continues until a target return is either identified or the entire range of clock pulses for the ADC has been examined.

The features and advantages described in this disclosure and in the following detailed description are not all-inclusive, and many additional features and advantages will be apparent to one of ordinary skill in the relevant art in view of the drawings, specification, and claims hereof. Moreover, it should be noted that the language used in the specification has been principally selected for readability and instructional purposes and may not have been selected to delineate or circumscribe the inventive subject matter. Reference to the claims is necessary to identify such inventive subject matter.

BRIEF DESCRIPTION OF THE DRAWINGS

The aforementioned and other features and objects of the present invention and the manner of attaining them will become more apparent, and the invention itself will be best understood, by reference to the following description of a preferred embodiment taken in conjunction with the accompanying drawings, wherein.

Figure 1:
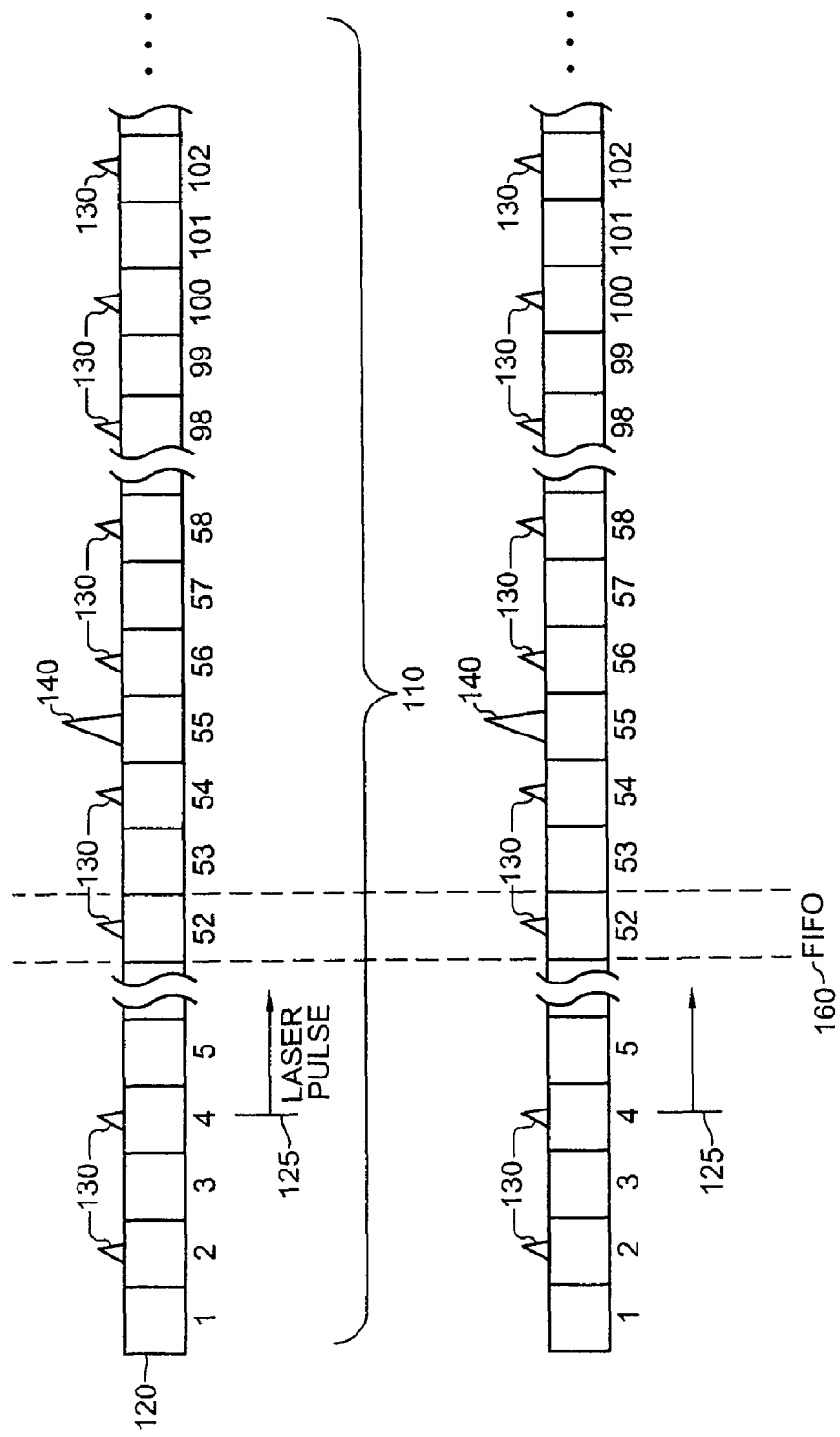
FIG. 1 is a graphical representation of an ADC sampling period associated with memory allocations, according to an embodiment of the present invention.

The Figures depict embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION OF THE PREFERRED EMBODIMENTS

The energy of a detected pulse fired by a laser range finder is dependent on many factors. Certainly one of the primary factors is the distance to the target. As one would expect, the more distant the target the less expected energy in the return. In many laser range finders the distance to a particular target is not determined by the relative strength of the detected pulse but rather by the time that has elapsed from the time the pulse was fired to the time a return pulse was detected. It therefore follows that the maximum detection range of such a laser range finder is its ability to differentiate a return pulse over noise.

A system and method for reducing the effects of noise due to sub-harmonic frequencies of clock pulses associated with the conversion of an analog signal to digital code are described hereafter. According to an embodiment of the present invention, systematic noise caused by sub-harmonic frequencies of the processor clock driving an ADC can be eliminated. Systematic noise driven by the ADC clock creates false signals that are distinct from random noise detected by the receiver that can be eliminated by dithering. By shifting the timing associated with each firing of a laser pulse, systematic (clock driven) noise can be eliminated. Returns from the time altered pulses are realigned in memory resulting in the elimination of ADC systematic error.

Specific embodiments of the present invention are hereafter described in detail with reference to the accompanying Figures. Like elements in the various Figures are identified by like reference numerals for consistency. Although the invention is described and illustrated with a certain degree of particularity, it is understood that the present disclosure has been made only by way of example and that numerous changes in the combination and arrangement of parts can be resorted to by those skilled in the art without departing from the spirit and scope of the invention.

According to an embodiment of the present invention, systematic noise that is correlated with a clock frequency can be substantially reduced. As previously discussed, the internal structure and functionality of ADCs produce a systematic error that is correlated to the clock frequency. Switches within the ADC that are responsible for sampling the analog signal generate noise based on received clock pulses. This switching is linked to a sub-harmonic clock frequency.

Recall that for each laser pulse fired, the return signal is sampled by the ADC at a particular clock frequency. These returns are summed with data from previous pulse firings and saved as a new summation in a First In/First Out ("FIFO") memory system or other suitable memory system. In normal operation each memory location in the FIFO corresponds to the same clock pulse number for each laser pulse fired.

FIG. 1 is an illustration of a series of laser pulse firings and several spurious signals associated with each sampled return signal of each laser pulse. An ADC sampling period 110 is divided into a number of equal listening periods 120. For purposes of this example, the laser pulse is fired 125 in period 4 of the sampling period and a return is detected 140 in period 55.

In the first instance of sampling, spurious signals 130 are received in periods 2, 4, 52, 54, 56, 58, 98, 100, and 102 and a target signal 140 is received in period 55. In the second instance of sampling, spurious signals 130 are again received in periods 2, 4, 52, 54, 56, 58, 98, 100, and 102, and again the target signal is received in period 55. While this pattern of spurious signals shows an error occurring at every other clock pulse, other patterns of systematic noise can occur and are equally addressed by the present invention. Each sampling period is associated with a FIFO memory location 160. Thus as data is summed over a series of pulses, the spurious signal sums are not suppressed with respect to the target return.

Figure 2:
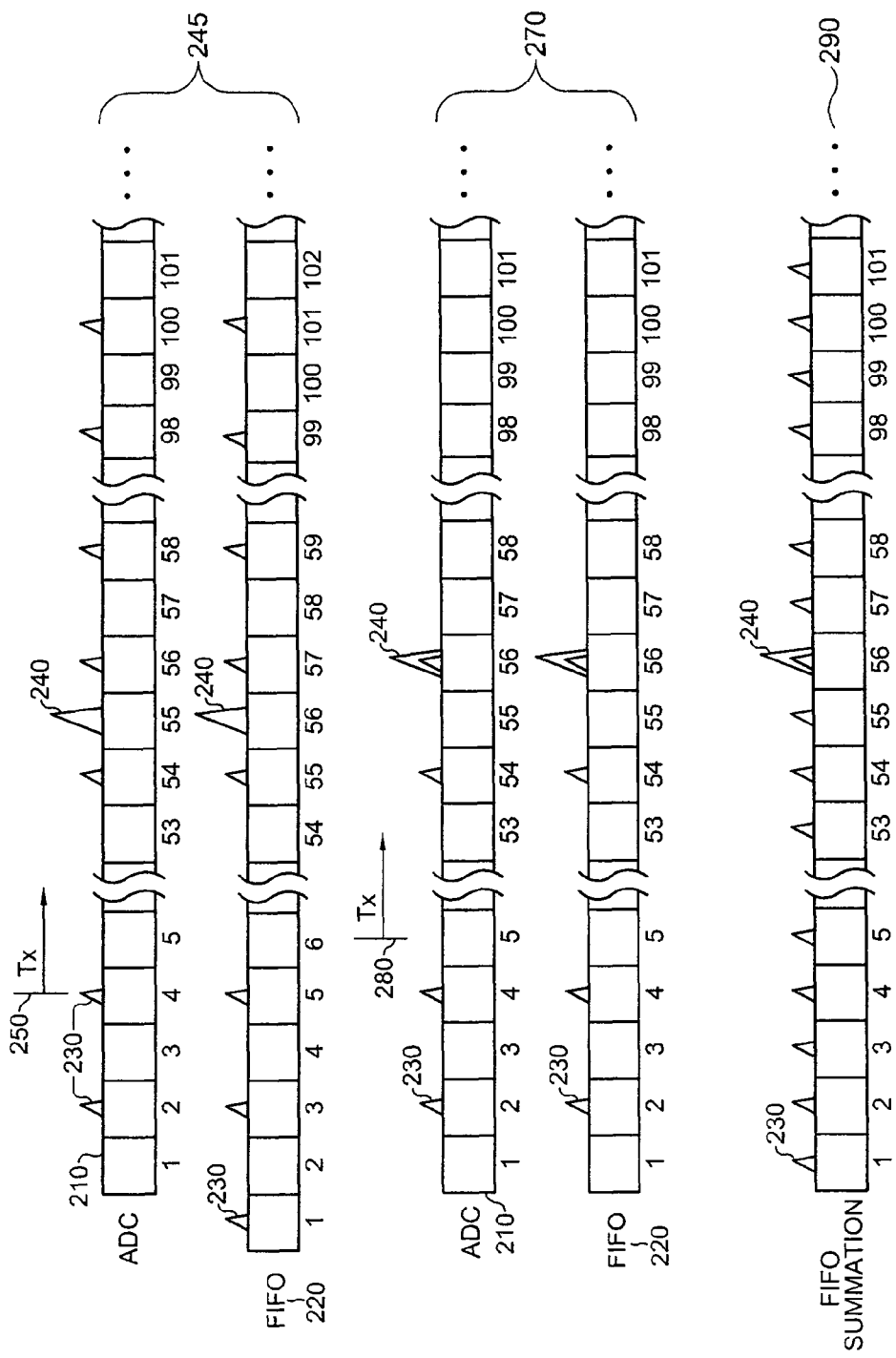
FIG. 2 is a graphical representation of two ADC sampling periods and memory allocations with shifted transmissions, according to an embodiment of the present invention.

According to an embodiment of the present invention, the impact of false signals can be reduced by shifting the firing of the laser pulse over a series of pulses. By altering the transmission of the laser pulse with respect to the ADC sampling periods, the systematic error can be effectively eliminated. FIG. 2 shows a shifted laser pulse firing pattern that, according to one embodiment of the present invention, eliminates systematic noise caused by clock sub-harmonics.

FIG. 2 shows a firing and sampling pattern for the firing of a series of laser pulses. Each sampling period 210 is associated with a FIFO memory location 220. The upper portion 245 of FIG. 2 shows, of a series of odd laser pulse firings, the sampling and FIFO association for the odd firings. The middle portion 270 of FIG. 2 shows the sampling periods and FIFO memory associations of even laser pulse firings. With respect to the odd firings 250 (e.g. laser firings 1, 3, 5, . . . ) it can be seen that at every second sampling period (e.g. periods 2, 4, 6, . . . ) a spurious signal 230 attributed to clock sub-harmonics is detected. In this particular example, the laser is fired 250 during sample period 4 and a target return 240 is detected at period 55. The FIFO memory location 220 is shifted by $T_{-1}$. Thus while the target return 240 is actually detected in period 55, it is stored in FIFO location 56.

The even firings 270 of the laser (e.g. laser firings 2, 4, 6, . . . ) also experience spurious signal 230 detections at sampling periods 2, 4, 6 . . . . The laser, however, is fired during sampling period 5 with a return detected at sampling period 56. Thus the FIFO shift of $T_{-1}$ is consistent with the laser firing shift from sample period 4 to sample period 5. Note that both the even 270 and the odd 245 firings of the laser result in the same time of flight between the firing of the laser and the detected return.

As a result of the odd/even shift in the laser firings in combination with the FIFO memory shift, when the odd and even data are summed the spurious systematic error is evenly distributed at every memory location while the target return is linearly additive. A depiction of the resulting FIFO memory location after a series of laser pulse firings can be seen in the lower portion 290 of FIG. 2. As can be seen, the target return is easily distinguishable over the evenly distributed systematic noise 230. Note that in the example illustrated in FIG. 2 the FIFO clock was advanced by one for the odd firings. The system for reduction of systematic noise can be equally implemented by delaying the FIFO clock by one cycle for the even laser pulses.

Figure 3:
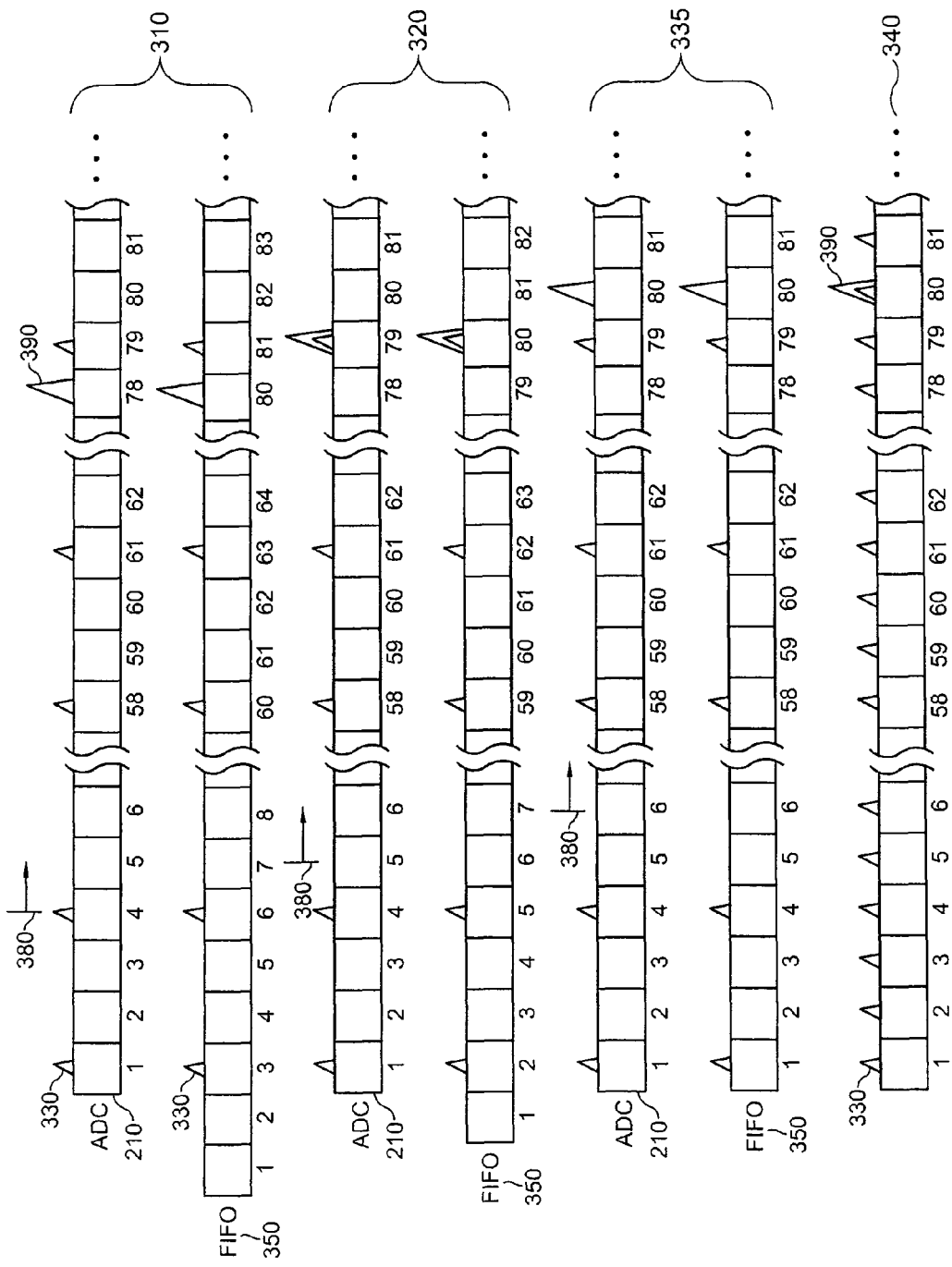
FIG. 3 is a graphical representation of three ADC sampling periods and memory allocations with shifted transmissions, according to an embodiment of the present invention.

To further illustrate the ability of the present invention, consider the example shown in FIG. 3. FIG. 3 shows a depiction of a shifting transmission of a laser pulse 380 combined with FIFO memory 350 allocation to accommodate spurious signals 330 that occur at an interval of every third clock pulse. FIG. 3 shows three combinations of sampling periods 210 from the ADC combined with the FIFO location 350 assigned to each sampling period. Note that when moving the laser firing pulse 380, the shift of the FIFO allocation must be an integer multiple of the sub-harmonic that is to be reduced. Thus in this case, since the spurious signal occurs every three clock pulses, three firing shifts (or an integer multiple) must be used. FIG. 3 shows three differing firing pulse configurations 380 with respect to the FIFO memory 350 for each sampling period. In the first configuration 310 the FIFO memory is shifted by $T_{-2}$. Thus the spurious signal received at sampling periods 1, 4, and 7 are stored in FIFO locations 3, 6, and 9 respectively. In this configuration the laser is fired during period 4.

In the second configuration 320 the laser is fired 380 at period 5. The FIFO memory 350 is shifted by $T_{-1}$ resulting in the noise received during periods 1, 4, and 7 being stored in FIFO locations 2, 5, and 8 respectively. Finally the third configuration 335 does not include a FIFO shift ($T_0$) thus the signals received during periods 1, 4, and 7 are stored in FIFO locations 1, 4, and 7 respectively. In this case the laser is fired during period 6. This pattern of memory allocations and laser firings continues over the entire set of laser pulses. Note that the detected signal is always stored in memory location 80.

Thus the resulting FIFO memory 340 after summing the series of laser pulses shows an even distribution of the spurious signals 330 with the laser return signal 390 being linearly additive and easily distinguishable. Note that, according to the present invention, the shifting patterns of the laser firings and FIFO locations can be combined to form a pattern that matches the spurious signal generation of the ADC. Thus, when using the method of moving the laser ($T_x$) firing point to reduce the effects of a number of sub-harmonics, the total number of clock configurations must be an integer that is divisible by all of the sub-harmonics. So, for example, to reduce the effects of the sub-harmonics found at clock pulses $F_o/2$, $F_o/4$, and $F_o/6$ (i.e. a separate spurious signal every other clock pulse ($F_o/2$), a different spurious signal every fourth pulse ($F_o/4$), and yet a different spurious signal every sixth pulse ($F_o/6$)), the smallest number that is an integer is 12. Therefore, both the number of clocks and the number of firing positions must be a multiple of 12. (Typically the least number of firing positions will be used to conserve memory). Note that FIGS. 2 and 3 show the relationships between the ADC sampling clock and the FIFO clock for consecutive laser pulses. This is not a requirement of the present invention. Since a great many laser pulses will generally be used to acquire a very weak target (typically 1000-3000 or more), the laser pulses can be fired in groups. Referring again to the depiction shown in FIG. 3, the diagram shows the minimum requirement of 3 laser pulses needed to eliminate the $F_o/3$ sub-harmonic. This pattern can be repeated until the target is acquired or groups of pulses at each firing position can be used. For example, at $T_x=4$ and FIFO=−2 offset 100 pulses can be summed. Then 100 more pulses at $T_x=5$ and FIFO=−1 offset. Then 100 more pulses at $T_x=6$ and FIFO=0 offset. The sum of all 300 pulses when re-aligned will have eliminated the $F_o/3$ sub-harmonic.

Figure 4:
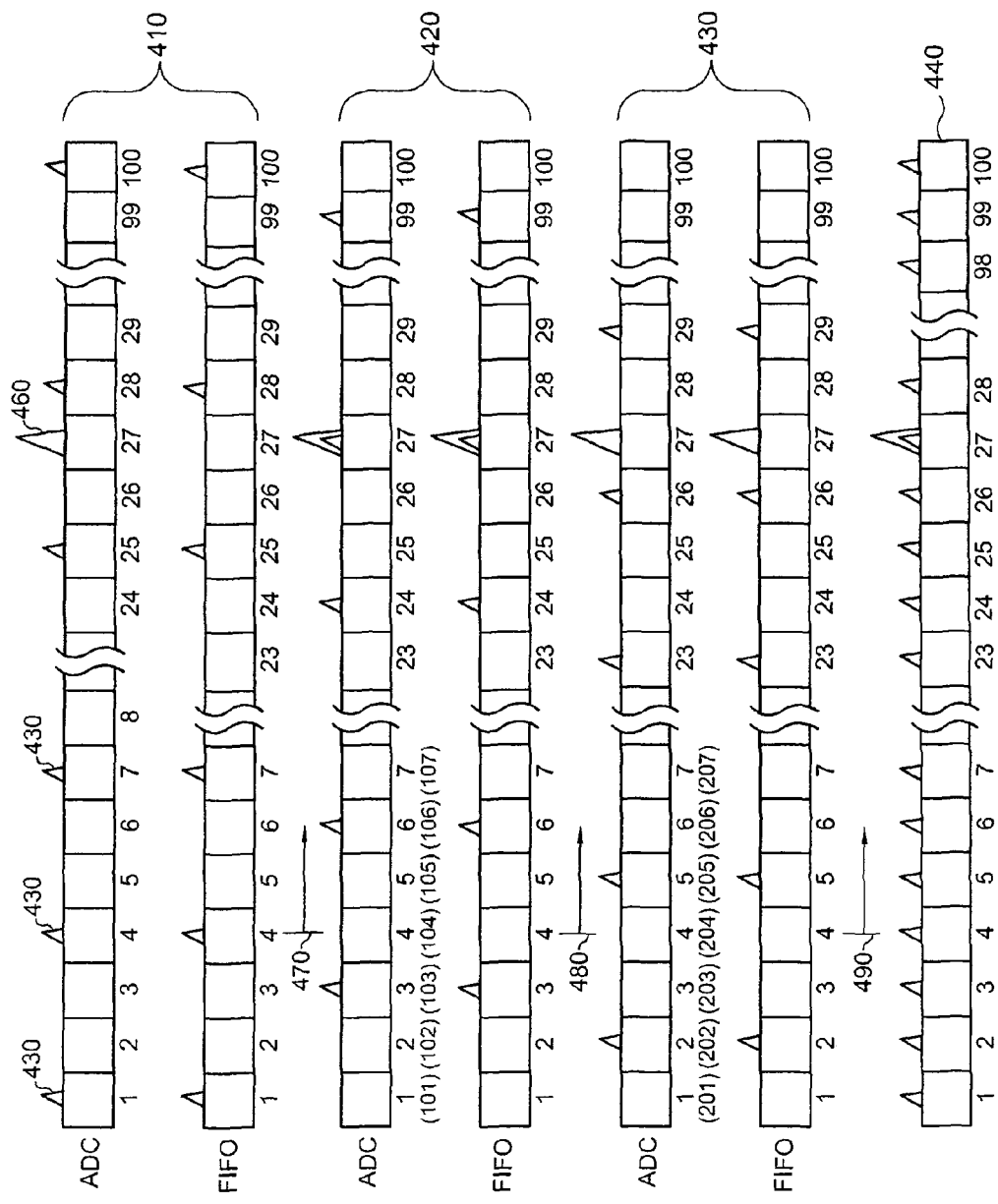
FIG. 4 is a graphical representation of three ADC sampling periods of a predetermined length and memory allocations according to an embodiment of the present invention.

Another embodiment of the present invention, as shown in FIG. 4, maintains a consistent firing of each pulse with respect to a set of ADC clocks but manipulates the number of ADC clocks. By setting the number of clocks in the ADC to a multiple of the sub-harmonic noise plus or minus 1, the noise, over a plurality of pulse firings, can be evenly distributed throughout the FIFO.

With the number of ADC clocks being set as a multiple of the sub-harmonic noise, the systematic signal (noise) will be associated with differing positions for each pulse firing. Over a series of laser pulse firings, the systematic error will be evenly distributed in the FIFO while a detected return will be consistently stored in the same FIFO bin.

Consider the following example to better illustrate this embodiment. Assume an ADC possesses a sub-harmonic signal (noise) at $F_o/3$. This means that as the ADC receives, from the receiver, signals to be converted to a digital code, a spurious signal exists that is systematically associated with every third bit. Thus for the conversion of the received signals associated with the first laser pulse, a spurious signal 450 will occur at bit numbers 1, 4, 7 . . . and so forth until the predetermined number of ADC clocks, in this case 100, is reached. These systematic signals (noise) are in addition to any target return signal 460 that may or may not have been detected by the receiver.

According to this embodiment, the laser pulse is fired 470 at the same clock time for each pulse. Using the same example, assume that the laser pulse is always fired 470 at the fourth clock cycle. According to this embodiment of the present invention, the number of clocks for the ADC must be set at a multiple of the sub-harmonic plus or minus one. Since the sub-harmonic in this case is 3, the number of clocks can be set to 99+1 or 100. One skilled in the relevant art will recognize that the number clocks could be any multiple of the harmonic, 3 plus or minus one, and that the number 99 is arbitrary and used for illustrative purposes only.

As previously described for the first firing of the laser, the ADC will generate noise at clocks 1, 4, 7 . . . 97, and 100. The laser will fire at clock 4 and, for the purpose of this example, assume a target return occurs at clock 27.

For the second firing 480 of the laser, another 100 clock periods are used. The laser is again fired at clock period 4. However, the ADC continues with the sub-harmonic pattern of noise associated with every third bit. Since the last clock period of the first firing, 100, was one of the sub-harmonics of the ADC, the third bit of the second firing will also have a sub-harmonic. From the second firing's perspective, the sub-harmonic occurs on clock periods 3, 6, 9, . . . 96, 99. But from the ADC perspective, the second firing is simply a continuation of the ADC sub-harmonic. Thus 3, 6, 9, . . . 96, 99 clock periods from the second firing's perspective are ADC clock periods 103, 106, 109, . . . 196, and 200.

Similarly the sub-harmonics for the third firing 490 will occur on clock period 2, 5, 8, . . . 98. Again, however, the laser will fire on clock period 4 in this third set of 100 clock periods. As the digital codes of each clock period are summed in the FIFO, the systematic noise associated with this sub-harmonic is evenly distributed over the entire 100 clock periods. The return found in clock period 27, however, is linearly additive creating a statistically distinguishable value.

One skilled in the relevant art will recognize that the technique described above is not limited to the sub-harmonic plus or minus one but is more generally a multiple of the sub-harmonic. For example, for an ADC that possesses a sub-harmonic noise characteristic of $F_o/5$ a total number of clock periods for each firing can be set at a multiple of five plus or minus 2.

Any combination of the above mentioned examples can be used to reduce or eliminate systematic noise so as to distribute the spurious signals across all memory locations while the target return remains associated with the same memory location.

The typical sub-harmonic values are approximately ¼-½, of the least significant bit ("LSB") in magnitude. Once eliminated and using noise dithering, targets at <1/10LSB can be detected. By increasing the number of offsets, realigning the returns in the FIFO and averaging the results, the systematic clock error induced by the ADC is eliminated. As opposed to a moving average filter or other filter methods, the sought-after signal, the return, is not degraded using the present invention, especially for large divisor sub-harmonics. The present invention enables the return, the detected signal, to line up on the same clock point and grow linearly while the systematic background error is eliminated.

Figure 5:
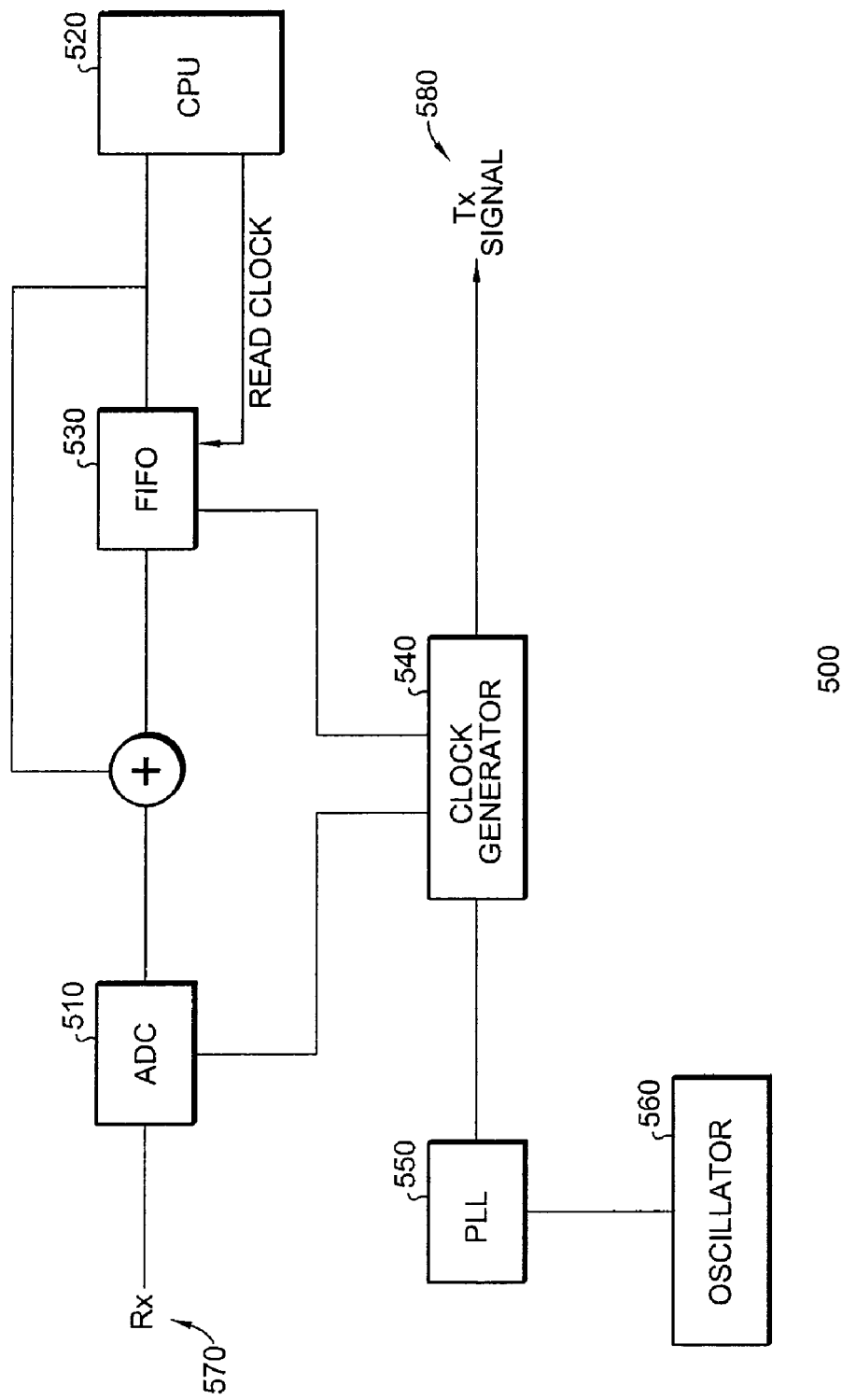
FIG. 5 is a high level block diagram of a system for reducing systematic noise of an ADC by summing digital codes in a FIFO memory, according to an embodiment of the present invention.

Turning now to FIG. 5, a high level block diagram of a system for reducing systematic noise associated with an ADC according to one embodiment of the present invention is shown. The system 500 includes an ADC 510, a CPU 520, a FIFO memory 530, a clock generator 540, a phase lock loop 550, and an oscillator 560. A master clock signal is generated by the oscillator 560 and phase lock loop 550 and delivered to the clock generator 540. The clock generator issues a transmission signal 580 along with clock pulses for the ADC 510. According to an embodiment of the present invention, for each transmission 580, signals from the receiver, $R_x$ 570, are directed to the ADC 510 and converted from analog form to digital codes using clock pulses from the clock generator 540. The $R_x$ signals 570 include reflected detected signals from a $T_x$ signal 580 issued by the clock generator as well as sub-harmonic signals induced by the clock pulses.

The digital codes then convey to the FIFO 530 where they are stored. Over a plurality of transmitted signals 580, a corresponding plurality of received signals 570 are passed through the ADC 510 and converted into digital codes. Each of these sets of digital codes is summed with the previous digital codes in the FIFO. Upon completion of a series of signal transmission, the CPU 520 can read the bins of the FIFO and conduct a comparison to determine whether any FIFO bin possesses a statistically distinguishable value, i.e. a return.

The clock generator 540, according to an embodiment of the present invention, modifies the transmission signal 580 with respect to the ADC clock pulses according to the sub-harmonic noise. As previously described, by offsetting the firing position with respect to the clock pulse, the systematic error can be evenly distributed in the FIFO while a detected return is consistently summed in the same bin.

Figure 6:
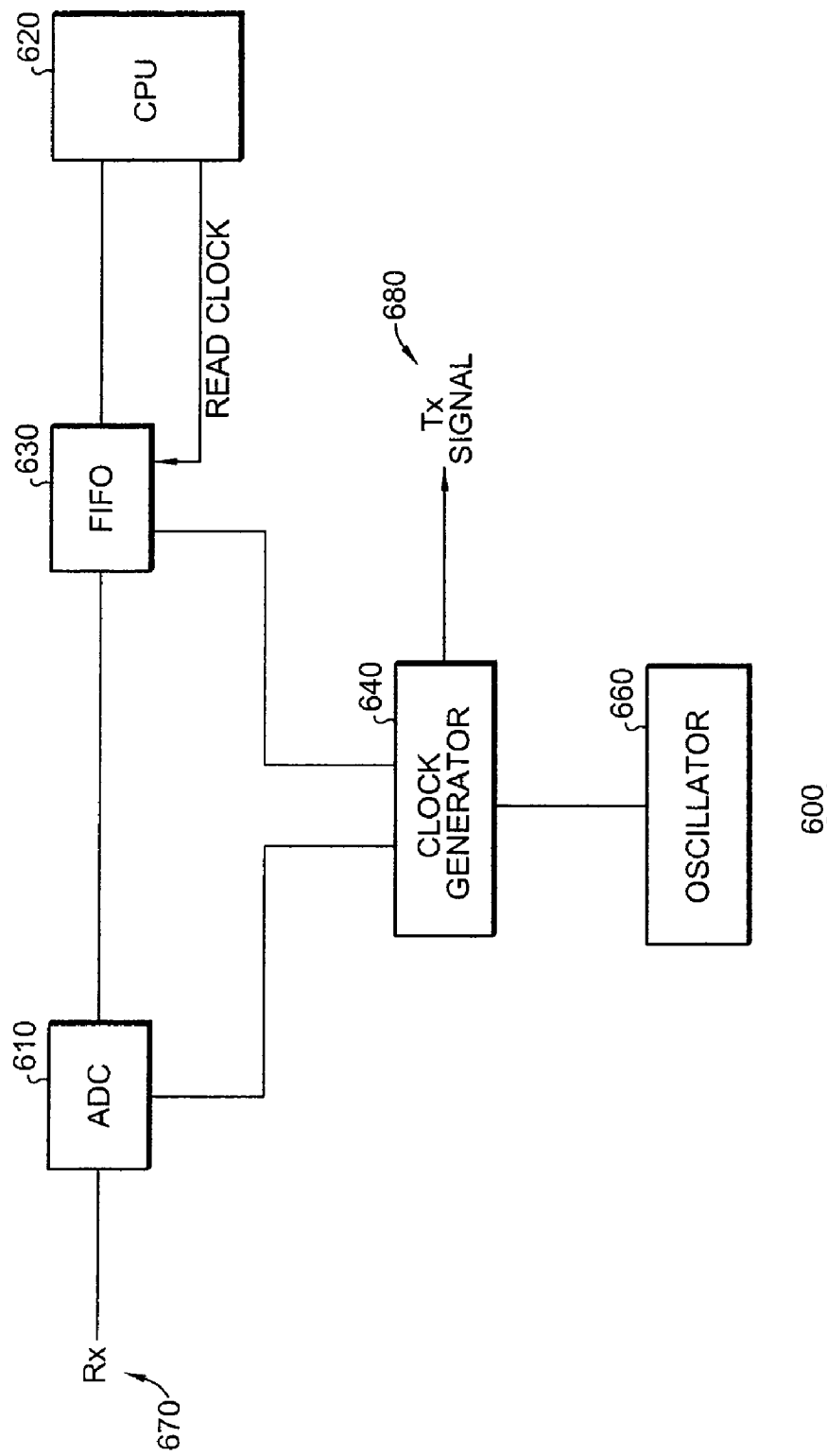
FIG. 6 is a high level block diagram of a system for reducing systematic noise of an ADC according to an embodiment of the present invention.

FIG. 6 is another high level block diagram of a system for reducing systematic noise associated with an ADC according to one embodiment of the present invention. As shown in FIG. 6, the oscillator 660 generates a master clock that is manipulated by the clock generator 640 according to the techniques described herein. The clock generator then issues a transmission signal 680 along with clock pulses for the ADC 610. According to an embodiment of the present invention, for each transmission 680, signals from the receiver, $R_x$ 670, are directed to the ADC 610 and converted from analog form to digital codes using clock pulses from the clock generator 640. The $R_x$ signals 670 include reflected detected signals from a $T_x$ signal 680 issued by the clock generator as well as sub-harmonic signals induced by the clock pulses. Those codes are then conveyed to a FIFO memory 630 wherein they are stored. The data stored in the FIFO 630 is then read by the CPU 620. This process occurs for each signal transmission.

Again the clock generator 640 modifies the firing signal with respect to the ADC clock pulses so as to evenly distribute sub-harmonic noise associated with ADC operations. According to this embodiment of the present invention the digital codes stored in the FIFO 630 are realigned and/or summed by the CPU 620 rather than in the FIFO 630. Once aligned, the CPU 620 can again compare the value in the various bins to determine whether a statistically distinguishable value exists that is representative of a return.

Figure 7:
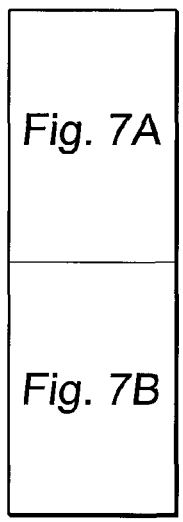
FIG. 7 is a flowchart of one method embodiment for reducing the effects of systematic clock error by shifting the firing pulse according to the present invention.
Figure 7A:
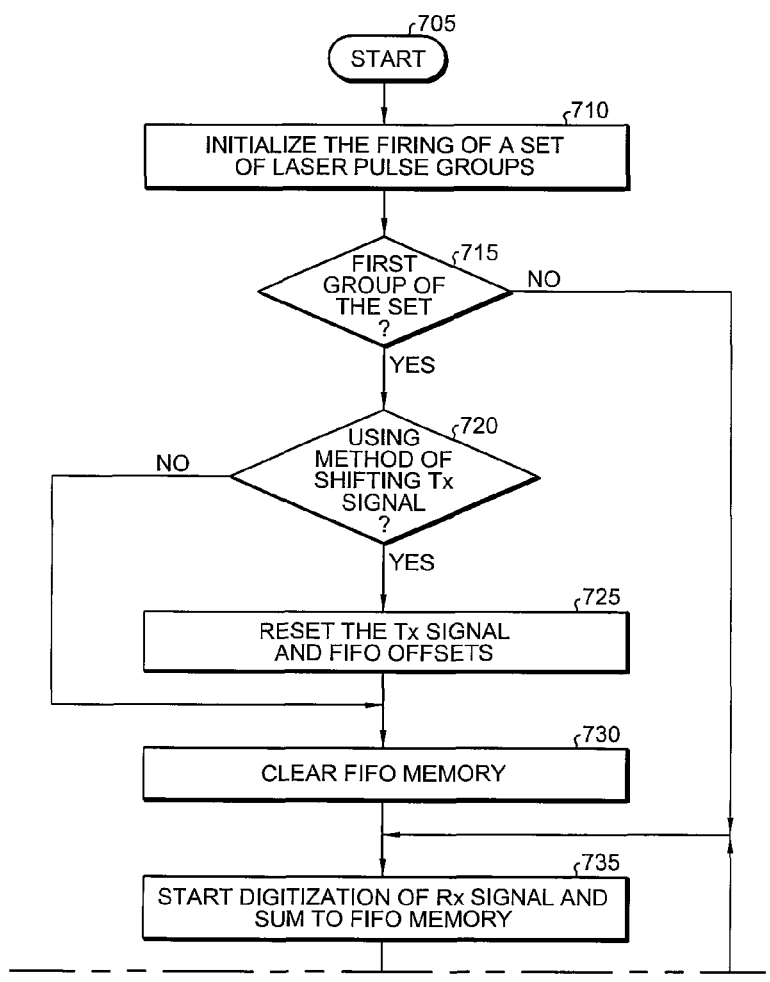
Figure 7B:
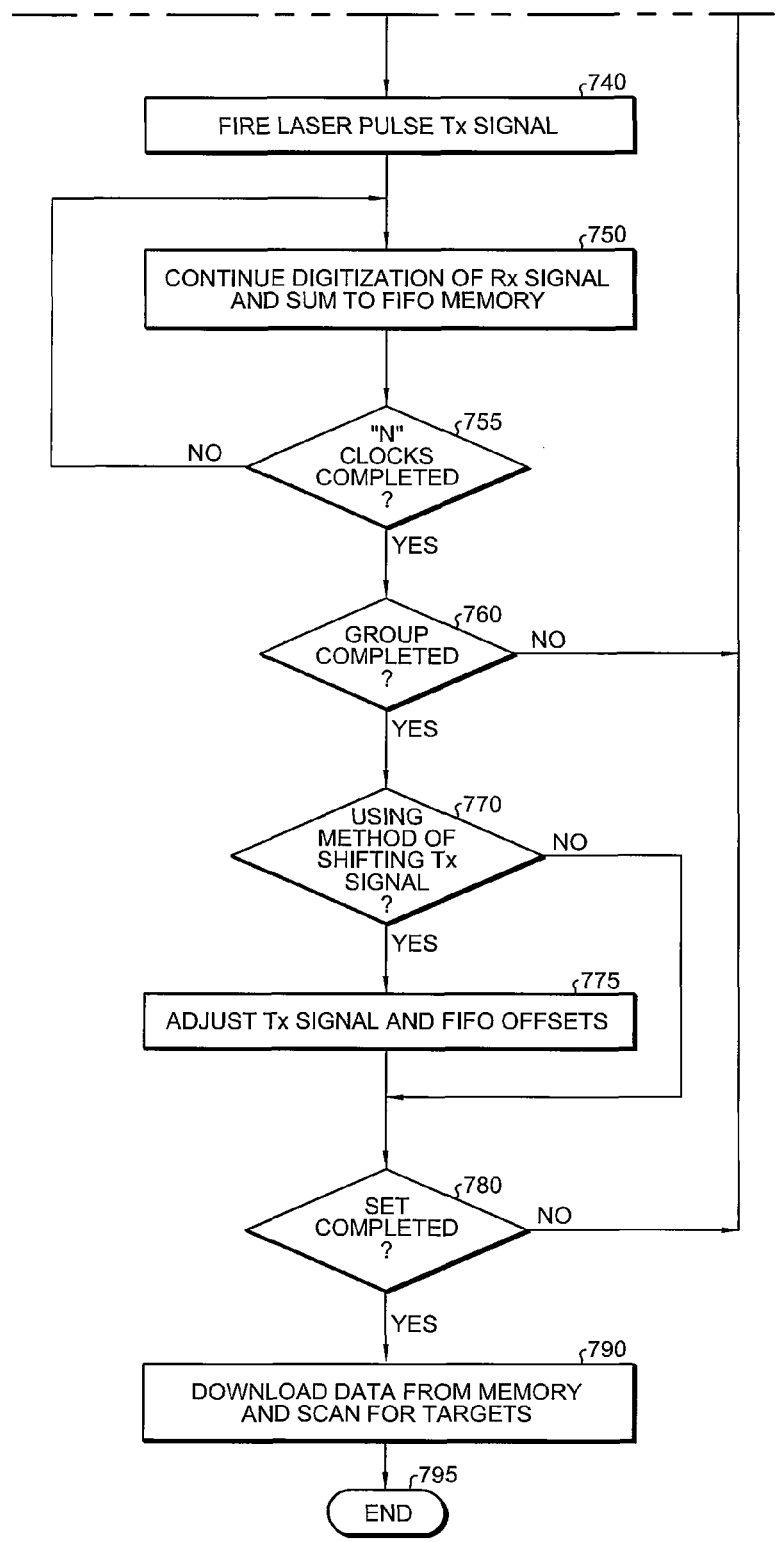

FIG. 7 is a high level flowchart of a method for reducing the impact of systematic noise introduced into a system by an ADC according to an embodiment of the present invention. As previously discussed, noise (error) introduced by an ADC includes systematic switching error caused by sub-harmonics of the clock function. The return signal of each laser pulse that is fired is sampled by the ADC according to a clock frequency. Systematic errors created by the sub-harmonics of the clock are converted by the ADC to create signals that limit the ability to detect small returns. The effects of these numerous returns is reduced by shifting the clock timing and averaging the returns.

FIG. 7 is a flowchart illustrating methods of implementing an exemplary process for reducing the effects of systematic clock error in analog to digital conversion. In the following description, it will be understood that each block of the flowchart illustrations, and combinations of blocks in the flowchart illustrations, can be implemented by computer program instructions. These computer program instructions may be loaded onto a computer or other programmable apparatus to produce a machine such that the instructions which execute on the computer or other programmable apparatus create means for implementing the functions specified in the flowchart block or blocks. These computer program instructions may also be stored in a computer-readable memory that can direct a computer or other programmable apparatus to function in a particular manner such that the instructions stored in the computer-readable memory produce an article of manufacture including instruction means which implement the functions specified in the flowchart block or blocks. The computer program instructions may also be loaded onto a computer or other programmable apparatus to cause a series of operational steps to be performed in the computer or on the other programmable apparatus to produce a computer implemented process such that the instructions which execute on the computer or other programmable apparatus provide steps for implementing the functions specified in the flowchart block or blocks.

Accordingly, blocks of the flowchart illustrations support combinations of means for performing the specified functions and combinations of steps for performing the specified functions. It will also be understood that each block of the flowchart illustrations, and combinations of blocks in the flowchart illustrations, can be implemented by special purpose hardware-based computer systems that perform the specified functions or steps, or combinations of special purpose hardware and computer instructions.

Systematic error associated with clock sub-harmonics can also be reduced or eliminated by shifting the firing time of an analog signal (such as a laser pulse), detecting a return, and then realigning the firing in memory. FIG. 7 shows one method embodiment for reducing systematic noise produced by sub-harmonic clock pulses in an ADC, according to the present invention.

The process begins 705 with the initialization 710 of the firing of a set of laser pulse groups. For the first group of the set 715 a query is made to determine whether 720 a method for shifting the transmission signal is used to reduce systematic ADC error. When the response to the query is in the affirmative, the transmission signals and FIFO offsets are reset 725. This step is bypassed when the method of manipulating the number of ADC clocks is utilized.

Thereafter the FIFO memory is cleared 730. Prior to issuing the analog signal, the digitization process of the received ($R_x$) signal is begun along with the summing of these signals into the FIFO memory 735. With the digitization of the ADC ongoing, a laser pulse (analog signal) is transmitted 740 ($T_x$). The digitization of the Rx signal continues 750 as does the summing of those digital codes into the FIFO memory until "N" clocks, where "N" is a predetermined number based on the method used, are completed 755. When the number of clocks of the listening period (or other predetermined period) have been completed, a query 760 is made to see whether the group of laser firings is complete. When the group has additional firings to complete, the process loops to the start of the digitization process 735. This loop continues until all laser firings within the first group are complete.

Next a determination is made whether 770 transmission shifting is to be applied. When the answer is yes, the transmission signal is adjusted 775 as are the FIFO offsets. As described herein, the shift of the transmission signal and/or FIFO offsets is based on the sub-harmonic noise associated with the ADC. When the answer to the query is no, this adjustment is bypassed. The process continues by determining next whether 780 the entire set is complete. When the method of manipulating the ADC clocks is utilized and the answer is no, the process returns to begin the digitization process of the ADC and reiterates the loops of another group.

When the entire set is complete, the data stored in the FIFO is downloaded and scanned 790 (compared) in a CPU or the like to determine whether a value in a FIFO bin is statistically distinguishable thus indicating the detection of a target and ending 795 the process. While in the process shown above the digital codes are summed and aligned in a FIFO, in another embodiment of the present invention the summation and/or alignment can be accomplished in the CPU.

As will be understood by those familiar with the art, the invention may be embodied in other specific forms without departing from the spirit or essential characteristics thereof. Likewise, the particular naming and division of the modules, managers, functions, systems, engines, layers, features, attributes, methodologies, and other aspects are not mandatory or significant, and the mechanisms that implement the invention or its features may have different names, divisions, and/or formats. Furthermore, as will be apparent to one of ordinary skill in the relevant art, the modules, managers, functions, systems, engines, layers, features, attributes, methodologies, and other aspects of the invention can be implemented as software, hardware, firmware or any combination of the three. Of course, wherever a component of the present invention is implemented as software, the component can be implemented as a script, as a standalone program, as part of a larger program, as a plurality of separate scripts and/or programs, as a statically or dynamically linked library, as a kernel loadable module, as a device driver, and/or in every and any other way known now or in the future to those of skill in the art of computer programming. Additionally, the present invention is in no way limited to implementation in any specific programming language, or for any specific operating system or environment. Accordingly, the disclosure of the present invention is intended to be illustrative, but not limiting, of the scope of the invention, which is set forth in the following claims.

We claim:

1. A method for reducing error resulting from converting plurality of analog signals to digital output by an analog to digital converter ("ADC"), said method comprising:
    converting, by the ADC, each of the received plurality of analog signals to a set of digital output codes wherein each set of digital output codes for each analog signal is stored in a memory;
    evenly distributing systematic error caused by the ADC by aligning in memory each set of digital output codes;
    summing digital output codes of each of the plurality of analog signals for each ADC clock pulse; and
    identifying an event by comparing each digital output code clock pulse summation.

2. The method of claim 1 further comprising shifting a clock reference time for each analog signal with respect to ADC clock pulses.

3. The method of claim 2 wherein shifting of the clock reference time for each analog signal is determined by a repetitive pattern of systematic error induced by clock sub-harmonics in the ADC.

4. The method of claim 1 wherein aligning each set of digital output codes is executed by an Application Specific Integrated Circuit by retrieving stored digital output codes from the memory and aligning each set of digital codes based on each analog signal's reference clock time.

5. The method of claim 1 wherein aligning a clock reference time associated with the ADC is executed by a Field Programmable Gate Array by retrieving stored digital output codes from the memory and aligning each set of digital codes based on each analog signal's reference clock time.

6. The method of claim 1 wherein the memory is a First In/First Out ("FIFO") memory.

7. The method of claim 6 wherein the FIFO memory is shifted to be aligned with the clock reference time for each analog signal firing.

8. The method of claim 6 wherein summing the digital output codes occurs in the FIFO memory.

9. The method of claim 1 wherein comparing is executed by an Application Specific Integrated Circuit.

10. A method for elimination of systematic error in analog to digital conversion, said method comprising:
receiving at an analog to digital converter ("ADC") a plurality of analog signals;
converting each of the plurality of analog signals to a set of digital codes by the ADC wherein each set of digital codes is associated with an initial ADC clock time;
storing in memory each set of digital codes wherein each digital code in the set of digital codes includes systematic error due to clock sub-harmonics;
aligning in memory each set of digital codes based on a firing clock time associated with generation of each analog signal to evenly distribute systematic error due to clock sub-harmonics;
summing in memory each digital code of each set of digital codes associated with the plurality of analog signal transmissions; and
comparing the summed set of digital codes to determine a statically distinguishable digital code.

11. The method of claim 10 further comprising shifting the firing clock time for each of the plurality of analog signal transmissions wherein each analog signal transmission possesses a unique firing clock time.

12. The method of claim 11 wherein shifting the firing clock time is based on repetitive systematic error associated with clock sub-harmonic operation of the ADC.

13. The method of claim 11 wherein each firing clock time is shifted in total by an integer related to systematic error associated with clock sub-harmonic operations of the ADC.

14. The method of claim 10 further comprising forming subsets of the plurality of analog signals wherein each analog signal within each subset of the plurality of analog signals is associated with a shifting of the firing clock time common to each subset of analog signals and wherein each subset of the plurality of analog signals is shifted, aligned, and summed in memory to eliminate systematic error due to clock sub-harmonics.

15. The method of claim 10 wherein the memory is a First In/First Out memory.

16. A system for elimination of systematic error in analog to digital conversion, said system comprising:
an analog to digital converter ("ADC") operable to convert each of a plurality of analog signals to a set of digital codes wherein each set of digital codes is associated with an initial ADC clock time and wherein each digital code in the set of digital codes includes systematic error due to clock sub-harmonics;
a clock generator operable to shift a firing clock time for each of the plurality of analog signals based on repetitive systematic error associated with clock sub-harmonic operation of the ADC; and
a processor operable to align in memory each digital code of the set of digital codes offset based on each firing clock time and to sum each digital code and wherein the processor compares each summed digital code to each other digital code of the set of digital codes to ascertain one digital code that is statistically distinguishable.

17. The system of claim 16 wherein each firing clock time is shifted, by the clock generator, in total by an integer related to systematic error associated with clock sub-harmonic operations of the ADC.

18. A system for elimination of systematic error in analog to digital conversion, said system comprising:
an analog to digital converter ("ADC") operable to convert each of the plurality of analog signals to a set of digital codes wherein each set of digital codes is associated with an initial ADC clock time and wherein each digital code in the set of digital codes includes systematic error due to clock sub-harmonics;
a clock generator operable, based on repetitive systematic error associated with clock sub-harmonic operation of the ADC, to shift a firing clock time associated with each of the plurality of analog signals and operable to shift memory bins associated with ADC operations;
a memory wherein each digital code of the set of digital codes is stored in separate memory bins of the FIFO and wherein successive storing of digital codes is summed in the separate memory bins;
a processor operable to compare digital code of each bin in the memory to digital code of each other bin in the memory to ascertain one digital code that is statistically distinguishable.

19. The system of claim 18 wherein the memory is a First In/First Out ("FIFO") memory.

20. A method for elimination of systematic error in analog to digital conversion, said method comprising:
receiving a plurality of analog signals wherein each of the plurality of detected analog signals is associated with a common firing clock time;
converting at an analog to digital converter ("ADC") each of the plurality of detected analog signals to a set of digital codes by the ADC;
storing in memory each set of digital codes wherein each set of digital codes includes systematic error due to clock sub-harmonics;
summing in memory each digital code of each set of digital codes associated with the plurality of analog transmissions; and
comparing each summed digital code to each other summed digital code to determine a statically distinguishable digital code.

21. The method of claim 20 wherein the predetermined number of clock pulses associated with ADC operation is based on a multiple of a sub-harmonic error interval associated with ADC operation plus or minus one.

* * * * *